United States Patent

Kamata

Patent Number: 5,324,963
Date of Patent: Jun. 28, 1994

[54] ELECTROLUMINESCENT SEMICONDUCTOR DEVICE HAVING CHALCOGENIDE LAYER AND MIXED CRYSTAL LAYER

[75] Inventor: Atsushi Kamata, Chigasaki, Japan

[73] Assignee: Kabushiki Kaisha Toshiba, Kawasaki, Japan

[21] Appl. No.: 30,870

[22] Filed: Mar. 12, 1993

[30] Foreign Application Priority Data

Apr. 13, 1992 [JP] Japan .................. 4-91400

[51] Int. Cl.⁵ .............. H01L 29/161; H01L 33/00
[52] U.S. Cl. .......................... 257/96; 257/94; 257/103; 257/614
[58] Field of Search .......... 257/96, 97, 102, 103, 257/614, 94

[56] References Cited

U.S. PATENT DOCUMENTS

| | | | |
|---|---|---|---|
| 4,315,796 | 2/1982 | Nishizawa | 156/614 |
| 4,868,615 | 9/1989 | Kamata | |
| 4,992,837 | 2/1991 | Sakai et al. | 257/97 |
| 5,091,758 | 2/1992 | Morita | 257/103 |
| 5,237,182 | 8/1993 | Kitagawa et al. | 257/96 |

FOREIGN PATENT DOCUMENTS

| | | | |
|---|---|---|---|
| 60-074483 | 4/1985 | Japan | 257/96 |
| 63-185077 | 7/1988 | Japan | 257/102 |
| 3-161982 | 7/1991 | Japan | |
| 3-235378 | 10/1991 | Japan | 257/102 |

OTHER PUBLICATIONS

Japanese Journal of Applied Physics vol. 29, No. 2, Feb., 1990 pp. L236-239, N. Kobayashi, et al. "Growth of ZnSe/GaAs Superlatives ... ".

Primary Examiner—Rolf Hille
Assistant Examiner—Mahshid Saadat
Attorney, Agent, or Firm—Oblon, Spivak, McClelland, Maier & Neudstadt

[57] ABSTRACT

A light-emitting diode has a GaAs substrate, and two ZnSe layers formed on the substrate and having a pn junction. An AuZn electrode is formed on the upper one of the ZnSe layers with a $(ZnSe)_x(GaAs)_{(1-x)}$ ohmic contact layer interposed therebetween. The coefficient x of the composition formula is substantially continuously varied from 1.0 to 0 from the ZnSe layer side. An AuGe electrode is formed on the lower surface of the GaAs substrate. The $(ZnSe)_x(GaAs)_{(1-x)}$ layer reduces the resistance between the ZnSe layer and AuZn electrode, and also prevents Ga atoms from diffusing into the ZnSe layer.

17 Claims, 4 Drawing Sheets

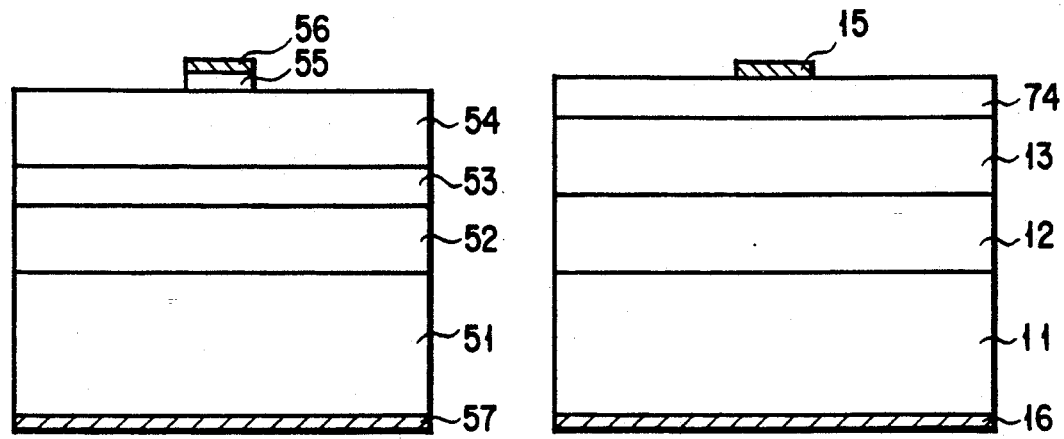
F I G. 5          F I G. 7
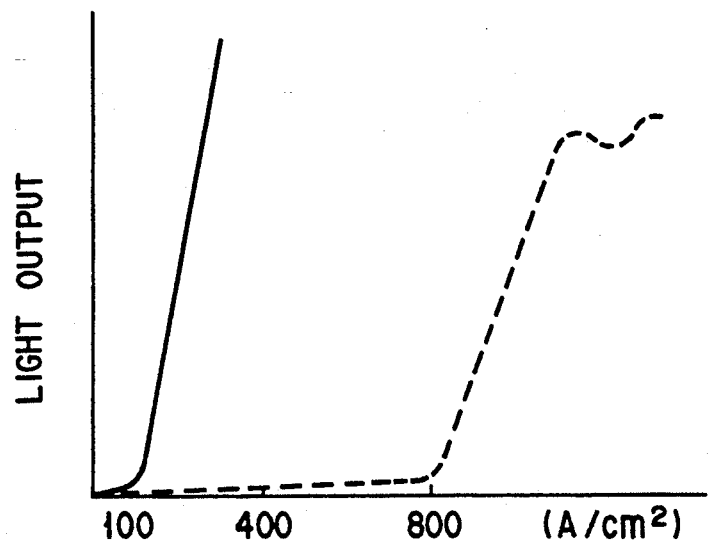
F I G. 6
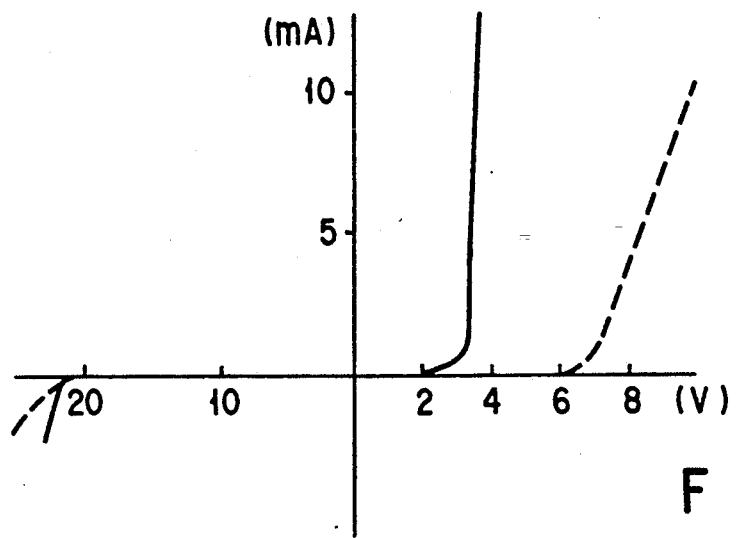
F I G. 8

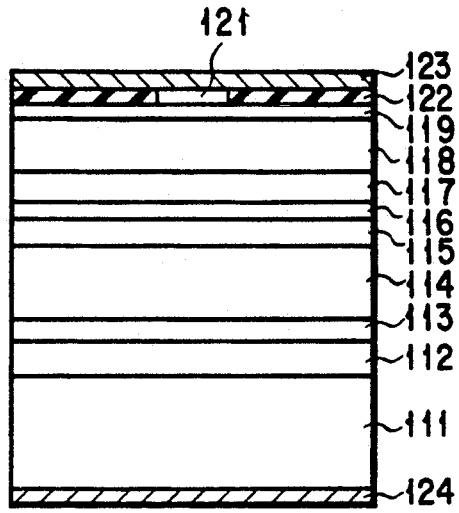
F I G. 12
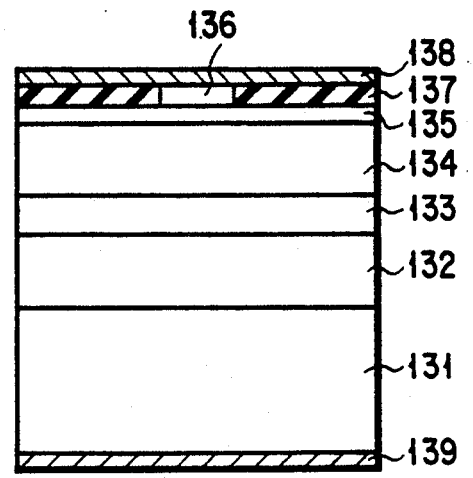
F I G. 13
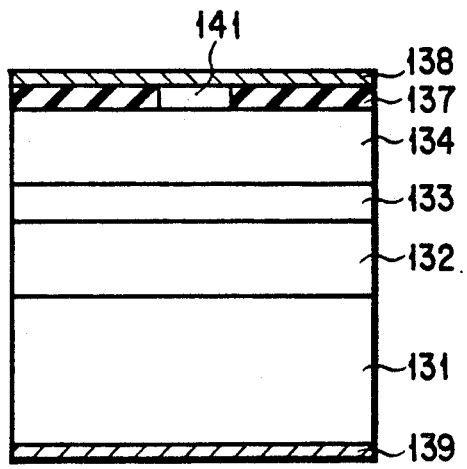
F I G. 14

ELECTROLUMINESCENT SEMICONDUCTOR DEVICE HAVING CHALCOGENIDE LAYER AND MIXED CRYSTAL LAYER

BACKGROUND OF THE INVENTION

1. Field of the Invention

This invention relates to a semiconductor device with a chalcogenide layer containing zinc or cadmium.

2. Description of the Related Art

A chalcogenide semiconductor containing zinc or cadmium has a band gap corresponding to the visible light region, and hence is expected to be used as a visible light-emitting semiconductor device. In particular, in a material mainly consisting of a zinc compound, light emission of wavelengths ranging up to a blue region has been confirmed, and this material is now being developed as a material of a shorter-wavelength light-emitting device.

However, incomplete ohmic contact between a chalcogenide layer and an electrode metal arises as a serious problem in the chalcogenide semiconductor device. Specifically, good ohmic contact cannot be made between the chalcogenide layer and Au or Pt, which are now widely used as electrode metals. Thus, a high contact resistance may occur between the electrode metal and chalcogenide layer, necessitating an increase in the voltage applied therebetween. As a result, a great amount of heat may be generated, causing defects in the crystal and hence deteriorating the semiconductor device.

To solve the above problem, the following light-emitting device has been proposed in Published Unexamined Japanese Patent Application No. 1-187885. As is shown in FIG. 15 in the application, an n-type ZnSSe crystal layer 152, a p-type ZnSSe crystal layer 153, and a p-type GaAs crystal layer 154 are formed on an n-type GaAs substrate 151 in the order mentioned. Reference numerals 155 and 156 denote electrodes. In this light-emitting device, the contact resistance can be reduced by growing a III-V group semiconductor layer on a p-type II-VI group semiconductor layer, and forming an ohmic electrode on the III-V group semiconductor layer.

This device, however, has the following problems:
1) The degree of valence band discontinuity is high between the III-V group compound and the II-VI group compound, which makes it difficult for holes to flow, and hence reduces the light-emission efficiency;
2) Since the GaAs crystal layer 154 is formed on the p-type ZnSSe crystal layer 153 as a p-type II-VI group semiconductor layer, Ga atoms in the GaAs layer 154 will diffuse into the layer 153, with the result that the conductivity type of the layer 153 will be shifted from the p type to the n type; and
3) Since the growth temperature of a III-V group compound such as GaAs is higher than that of a II-VI group compound, mutual diffusion will be caused by heat at the pn junction between the II-VI group semiconductor layers while the III-V group semiconductor layer is being grown. This diffusion may adversely affect the pn junction.

SUMMARY OF THE INVENTION

It is the object of the invention to provide a semiconductor device of high efficiency and performance as a result of eliminating the above-described problems which may be caused when a metal electrode is formed on a p-type chalcogenide layer.

The semiconductor device of the invention comprises:
- a p-type first layer consisting of a chalcogenide semiconductor containing zinc or cadmium;
- a semiconductor supporting layer consisting of an n-type semiconductor;
- first and second electrodes provided for the first and semiconductor supporting layers, respectively; and
- a second layer formed on the first layer and between the first layer and the first electrode, the second layer being made of a mixed crystal semiconductor consisting of group II, III, V, and VI elements or being consisting of a II-V group compound semiconductor.

Preferably, the second layer directly contacts both the first layer and first electrode, and a group II element or elements contained in the first layer are the same as the group II element or elements contained in the second layer.

The mixed crystal layer preferably has a thickness of 1000 Å or more to be used as a bulk, and contains the II-VI group compound more than 3% by weight, preferably 10–80% by weight.

In the invention, lattice matching in a boundary between the first layer consisting of a p-type II-VI group semiconductor and the second layer functioning as an ohmic contact layer is greatly enhanced, and discontinuity of the valence bands is eliminated. Thus, holes can flow smoothly, thereby enhancing the efficiency of light emission. The second layer prevents group III atoms, as an n-type impurity, from diffusing into the p-type II-VI group semiconductor layer, thereby suppressing the shift of the conductivity type of the first layer from the p type to the n type. Further, since the device can be grown at low temperature, the pn junction of the device can be prevented from breakage.

Moreover, the second layer is grown such that the composition thereof is varied in the thickness direction. Thus, a lowermost portion of the second layer mainly consists of the II-VI group compound, and an uppermost portion mainly consists of the III-V group compound. In this state, the concentration of III group atoms is low in a boundary between the second layer and first layer, so that the atoms are effectively prevented from diffusing into the first layer, and a contact member such as a metal electrode can be brought into good ohmic contact with the second layer.

In addition, laminating the II-V group compound semiconductor layer on the II-VI group compound semiconductor layer satisfactorily prevents discontinuity of the valence band, thereby enabling holes to flow smoothly. In this state, there exist no III group atoms such as Ga atoms in the vicinity of a boundary between the p-type II-VI group semiconductor layer and II-V group compound semiconductor layer. Accordingly, no III group atoms will diffuse into the II-VI group semiconductor layer, and hence the conductivity type of the p-type II-VI group semiconductor will not be changed to the n type.

Furthermore, the mixed crystal layer, II-V group compound semiconductor layer, and II-VI group compound semiconductor layer are grown at substantially the same temperature, which prevents deterioration of the elements due to heat.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a cross sectional view of a semiconductor laser according to a third embodiment of the invention;

FIG. 6 is a graph, showing the output/current characteristic of the semiconductor laser of the third embodiment and that of another semiconductor laser as a comparative example;

FIG. 7 is a cross sectional view of a light-emitting diode according to a fourth embodiment of the invention;

FIG. 8 is a graph, showing the current/voltage characteristic of the light-emitting diode of the fourth embodiment and that of another light-emitting diode as a comparative example;

FIG. 12 is a cross sectional view of a semiconductor laser according to a sixth embodiment of the invention;

FIG. 13 is a cross sectional view of a semiconductor laser according to a seventh embodiment of the invention;

FIG. 14 is a cross sectional view of a semiconductor laser according to an eighth embodiment of the invention.

DETAILED DESCRIPTION OF THE PREFERRED EMBODIMENTS

The embodiments of the invention will now be described in detail with reference to the accompanying drawings.

Figure 1:
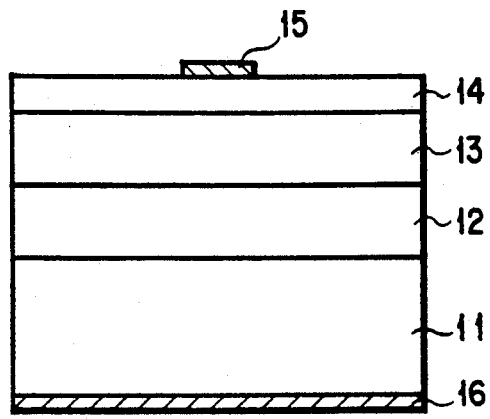
FIG. 1 is a cross sectional view of a light-emitting diode according to a first embodiment of the invention.

FIG. 1 is a cross sectional view showing a light-emitting diode according to a first embodiment of the invention. This diode was made in the following process:

An n-type ZnSe crystal layer 12 doped with $1 \times 10^{18}$ cm$^{-3}$ of Cl, a p-type ZnSe crystal layer 13 as a chalcogenide semiconductor layer containing zinc doped with $5 \times 10^{18}$ cm$^{-3}$ of N, and a $(ZnSe)_x(GaAs)_{(1-x)}$ layer 14 as a mixed crystal layer consisting of a II-VI group compound and a III-V group compound, were grown on an n-type GaAs substrate 11 doped with $3 \times 10^{18}$ cm$^{-3}$ of Si in the order mentioned and by the MOCVD method. The n-type ZnSe (zincselenide) 12 was grown while 10 μmol/min of DMZn (dimethylzinc), 20 μmol/min of DMSe, and 20 μmol/min of 1-chloropentane were supplied. The p-type ZnSe layer 13 was grown while 10 μmol/min of DMZn (dimethylzinc), 20 μmol/min of DMSe, and 200 μmol/min of NH$_3$ were supplied.

The $(ZnSe)_x(GaAs)_{(1-x)}$ layer was grown at 500° C. while 10 μmol/min of DMZn, 20 μmol/min of DMSe, 20 μmol/min of TMGa (trimethylgallium), and 400 μmol/min of AsH$_3$ (arsine) were supplied at the beginning. Then the relative supply rates of the gases were varied such that the coefficient x of the composition formula of the layer 14, functioning as an ohmic contact layer, was almost continuously varied from 1.0–0. That is, the layer 14 was grown such that its lowermost portion contacting the p-type ZnSe layer 13 had a composition substantially consisting of ZnSe, and its uppermost portion had a composition substantially consisting of GaAs.

All the layers 12–14 were formed under 1 atm at 500° C. with 2 SLM (Standard Liter per Minute) of a carrier gas. An Au-Ge electrode 16 was deposited on the lower surface of the substrate 11, and an Au-Zn electrode 15 which could be brought into an ohmic contact was deposited on the mixed crystal layer 14. Thereafter, flash annealing was performed at 500° C. for ten seconds.

Figure 2:
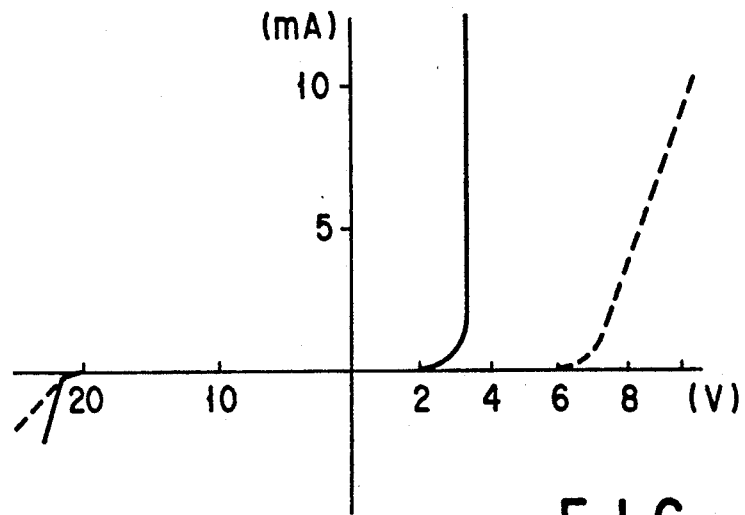
FIG. 2 is a graph showing the current/voltage characteristic of the light-emitting diode of the first embodiment and that of another light-emitting diode as a comparative example.

The current/voltage characteristic of the light-emitting diode thus obtained is indicated by the solid line in FIG. 2. As shown in FIG. 2, the forward threshold voltage was as low as 2.5 V, and the series resistance (i.e., the gradient of the solid line in the graph) obtained from the forward voltage was 0.4 Ω. On the other hand, the broken line indicates the characteristic of a device which was prepared as a comparative example by removing the mixed crystal layer 14. The forward threshold voltage of this device was as high as 7 V, and the series resistance was also as high as 5 Ω.

The reason why the device of the invention provides a low threshold voltage and series resistance will be explained as follows: In order for current to smoothly flow between the electrode and p-type semiconductor layer, the potentials of the valence bands must be continuously varied. In the embodiment, by continuously varying the composition of the mixed crystal layer 14 from ZnSe to GaAs, the layer 14 can be connected to the metal electrode 15 without discontinuity of the valence bands. Accordingly, the threshold voltage directly reflects the characteristic of the pn junction. Further, the contact resistance of a boundary between the metal and semiconductor is reduced, and hence the series resistance is reduced. On the other hand, the reason why the comparative example (device having an n-type ZnSe crystal layer and an electrode directly formed on the layer) has a high threshold voltage and series current is that a current barrier exists between the electrode and semiconductor.

In addition, since the device of the invention is formed at a relatively high temperature of 500° C. as for growing ZnSe, the crystals of the ZnSe crystal layers 12 and 13 are sufficiently grown, and a good pn junction is obtained. Moreover, since not so many Ga atoms are contained in that portion of the mixed crystal layer 14 which is in the vicinity of the p-type ZnSe crystal layer 13, Ga atoms will not diffuse into the layer 13, and hence the layer 13 provides a good p-type conductivity.

Figure 3:
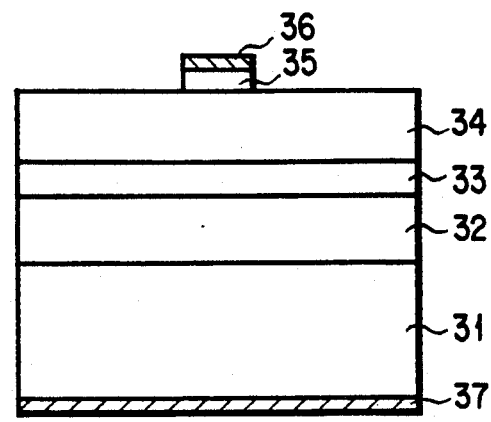
FIG. 3 is a cross sectional view of a light-emitting diode according to a second embodiment of the invention.

FIG. 3 is a cross sectional view of a light-emitting diode according to a second embodiment of the invention. This diode was made in the following process:

An n-type ZnSe crystal layer 32, a $Cd_xZn_{(1-x)}Se$ crystal layer 33, and a p-type ZnSe crystal layer 34 were laminated on an n-type ZnSe substrate 31 doped with $3 \times 10^{18}$ cm$^{-3}$ of I in the order mentioned. On the resultant structure, a mixed crystal layer 35 consisting of five $(ZnSe)_x(GaAs)_{(1-x)}$ layers (the value of x was varied in units of 0.2 from x=1 to x=0.2) is formed as an ohmic contact layer. That is, the layer 35 was formed such that the lowermost portion of the layer 35 which contacted the p-type ZnSe layer 34 had a composition of ZnSe, and the uppermost portion had a composition of $(ZnSe)_{0.2}(GaAs)_{0.8}$. An In-Ga electrode 37 was formed on the lower surface of the substrate 31, and an Au-Zn electrode 37 was formed on the layer 35. Thereafter, annealing was performed at 500° C. for ten seconds.

Figure 4:
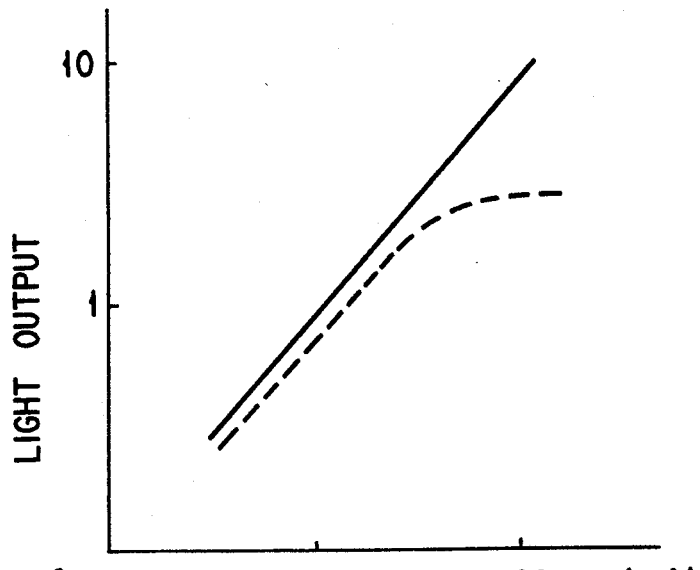
FIG. 4 is a graph, showing the output/current characteristic of the light-emitting diode of the second embodiment and that of another light-emitting diode as a comparative example.

The output/current characteristic in the output-light-spectrum-intensity of the light-emitting diode is indicated by the solid line in FIG. 4. The intensities of the outputs in FIG. 4 are shown as relative values, and the unit of the outputs defined by the ordinate can be freely chosen. Blue light of an intensity proportional to the current was obtained from the diode of the second embodiment. The characteristic of the comparative example having no mixed crystal layer 35 is indicated by the broken line in FIG. 4. In this case, it is found that output saturation will occur in a lower level region of current, that is, the entire output level is low.

Since the light-emitting diode of the second embodiment is formed at a relatively low temperature, it has a good crystal in each layer. Further, since not so many Ga atoms are contained in that portion of the crystal layer 35 which is in the vicinity of the p-type ZnSe crystal layer 34, those atoms are not diffused in the layer 34. Moreover, since the value x of $(ZnSe)_x(GaAs)_{(1-x)}$ layers is varied in units of 0.2 from 1 to 0.2, there is little band discontinuty between the ZnSe crystal layer 34 and crystal layer 35, and hence current can flow smoothly.

As is explained above, the light-emitting diode of the second embodiment has a considerably enhanced characteristic.

FIG. 5 is a cross sectional view, showing a semiconductor laser according to a third embodiment. This laser was made in the following process:

On a (100) plane n-type GaAs substrate 51, an n-type $ZnS_xSe_{(1-x)}$ clad layer 52 lattice matching with the substrate 51, an undoped $Cd_yZn_{(1-y)}Se$ active layer 53, and a p-type $ZnS_xSe_{(1-x)}$ clad layer 54 were laminated in the order mentioned. Then, a $(ZnSe)_{0.5}(GaAs)_{0.5}$ mixed crystal layer 55 functioning as an ohmic contact layer was laminated on the clad layer 54.

An In-Ga electrode 57 was formed on the lower surface of the n-type GaAs substrate 51, and an Au-Zn electrode 56 was formed on the mixed crystal layer 55.

Thereafter, flash annealing was performed at 500° C. for ten seconds. At this time, a forward voltage was applied to the resultant product, and lasing occurred at 77K.

FIG. 6 shows the output/current characteristic of the device of the third embodiment. The intensities of the outputs in FIG. 6 are shown as relative values, and the unit of the outputs defined by the ordinate can be freely chosen. The solid line indicates the characteristic of the embodiment, whereas the broken line indicates that of a comparative example, which has an Au electrode formed directly on the p-type $ZnS_xSe_{(1-x)}$ clad layer 54. The threshold current concentration was 100 A/cm$^2$ in the third embodiment, and 800 A/cm$^2$ in the comparative example. Further, the output was increased up to a high current density in the third embodiment, as compared to the comparative example. Since the resistance between the layer 54 and electrode 56 is considerably low, the device can lase at low current density, and the output thereof can be increased up to high current density.

Also in this embodiment, since the semiconductor laser is grown at relatively low temperature, and not so many Ga atoms exist in the vicinity of the layer 54, each layer has a good crystal, and there occurs less diffusion of Ga atoms in the p-type $ZnS_xSe_{(1-x)}$ clad layer 54, as compared to a case employing a p-type GaAs layer. This embodiment can also provide the above-described advantage of the invention.

FIG. 7 is a cross-sectional view of a diode according to a fourth embodiment of the invention. This diode was produced by the following process.

An n-type ZnSe crystal layer 12 doped with $1 \times 10^{18}$ cm$^{-3}$ of Cl, a p-type ZnSe crystal layer 13 doped with $5 \times 10^{18}$ cm$^{-3}$ of N, and a $Zn_xAs_y$ layer 74 made of a II-V group compound and functioning as an ohmic contact layer were laminated, by the MOCVD method, on an n-type GaAs substrate 11 doped with $3 \times 10^{18}$ cm$^{-3}$ of Si in the order mentioned. The n-type ZnSe layer 12 was grown while 10 μmol/min of DMZn, 20 μmol/min of DMSe, and 20 μmol/min of 1-chloropentane were supplied. The p-type ZnSe layer 13 was grown while 10 μmol/min of DMZn, 20 μmol/min of DMSe, and 200 μmol/min of NH$_3$ were supplied. The $Zn_xAs_y$ layer 74 was grown to have a thickness of 200 nm, while 10 μmol/min of DMZn and 400 μmol/min of AsH$_3$ were supplied. These layers were grown under 1 atm at 500° C. while 2 SLM of a carrier gas was supplied.

An Au-Ge electrode 16 was deposited on the lower surface of the substrate 11, and an Au-Zn electrode 15 was deposited on the $Zn_xAs_y$ layer 74. Thereafter, the resultant product was heated at 500° C. for three minutes in an atmosphere of hydrogen. The current/voltage characteristic of the thus obtained diode is indicated by the solid line in FIG. 8. The broken line in FIG. 8 indicates a comparative example in which an Au electrode is formed directly on the p-type ZnSe layer 13 without a $Zn_xAs_y$ layer interposed therebetween. As is evident from the figure, the diode of the fourth embodiment has a diode characteristic better than the comparative example. In the comparative example, the forward threshold voltage is high, and the series resistance (i.e., the gradient of the broken line in the graph) of the device based on the current/voltage characteristic is considerably high. This is because the contact resistance between an electrode on the p side, i.e., anode side, and the semiconductor layer is high.

As in the light-emitting diode of the fourth embodiment, the contact resistance between the p-type ZnSe layer 13 and Au-Zn electrode 15 can be reduced by interposing therebetween the $Zn_xAs_y$ layer 74 functioning as an ohmic contact layer.

Figure 9:
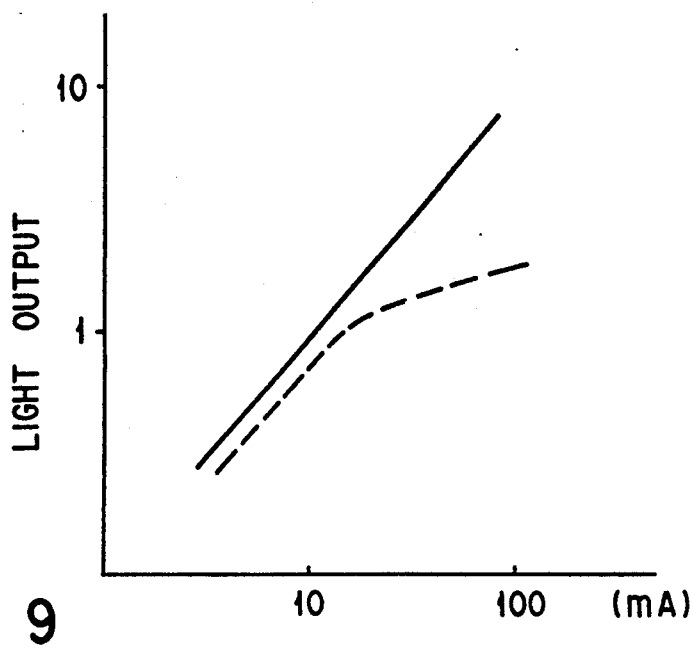
FIG. 9 is a graph, showing the output/current characteristic of the light-emitting diode of the fourth embodiment and that of another light-emitting diode as a comparative example.

FIG. 9 shows the light output characteristics of the light-emitting diode of the fourth embodiment and comparative example. The intensities of the output in FIG. 9 are shown as relative values, and the unit of the light outputs defined by the ordinate can be freely chosen. The optical output increased up to high level in the fourth embodiment, whereas in the comparative example, the optical output was saturated at low current level since it was influenced by heat caused due to its high resistance.

The $Zn_xAs_y$ layer 74 made of a II-V group compound does not contain III group atoms which will become an n-type impurity in the p-type ZnSe layer 13 made of a II-VI group compound semiconductor, and may shift the conductivity type of the layer 13 from the p type to the n type, when they diffuse into the layer 13. Further, the growth temperature of $Zn_xAs_y$ is substantially equal to that of ZnSe, which prevents the device from being deteriorated by heat. In addition, since $Zn_2As$, which belongs to $Zn_xAs_y$, has a tetragonal system and the length of the C axis is almost as twice as that of ZnSe, and can has a excellent continuity in lattice structure in relation to ZnSe. Accordingly, when $Zn_2As$ is used, there is no defect in a boundary between $Zn_2As$ and ZnSe, and hence current can flow smoothly.

Figure 10:
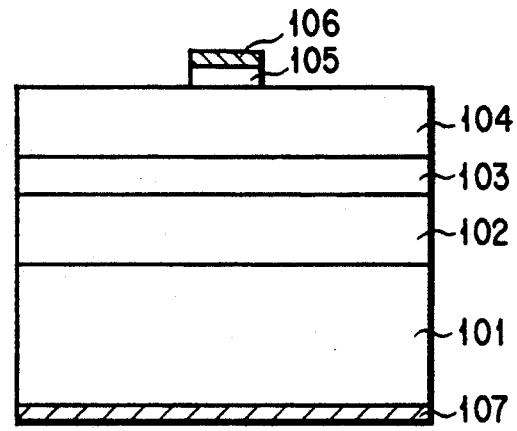
FIG. 10 is a cross sectional view of a semiconductor laser according to a fifth embodiment of the invention.

FIG. 10 is a cross sectional view, showing a semiconductor laser according to a fifth embodiment of the invention. This laser was made in the following process:

An n-type ZnSSe crystal layer 102, an undoped CdZnSe crystal layer 103, and a p-type CdZnSSe crystal layer 104 were laminated on an n-type GaAs substrate in the order mentioned. On the resultant structure, a $Cd_xZn_{(1-x)}As$ layer 105 made of a II-V group compound is laminated as an ohmic contact layer. An Au-Ge electrode 107 was deposited on the lower surface of the substrate 101, and an Au-Zn electrode 106 was deposited on the layer 105.

Figure 11:
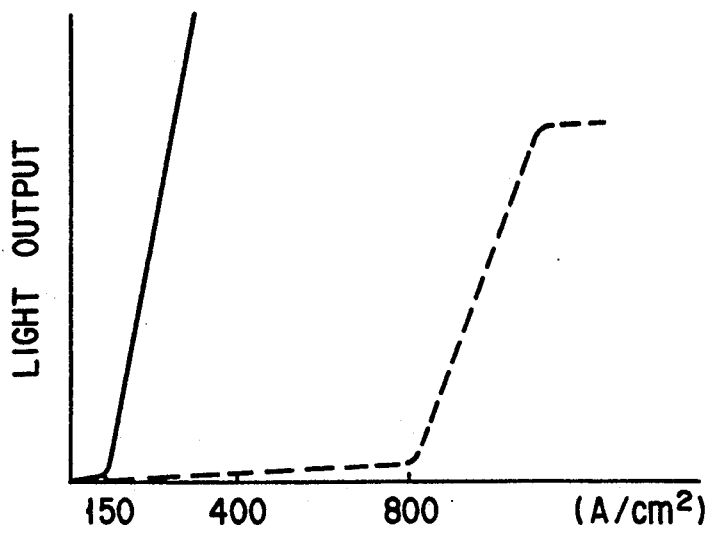
FIG. 11 is a graph, showing the output/current characteristic of the semiconductor laser of the fifth embodiment and that of another semiconductor laser as a comparative example.
Figure 15:
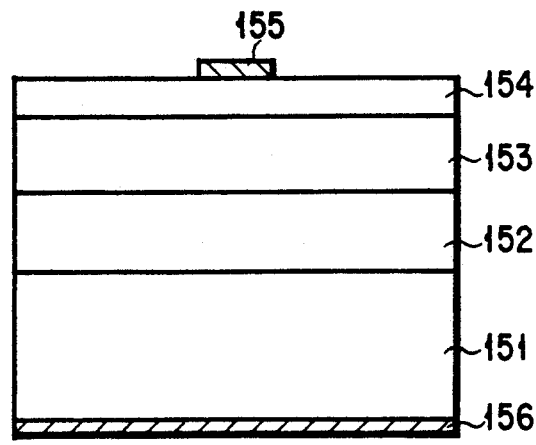
FIG. 15 is a cross sectional view, showing a conventional light-emitting diode.

The optical output characteristic of the thus-obtained semiconductor laser is indicated by the solid line in FIG. 11. On the other hand, the broken line in FIG. 11 indicates the characteristic of a comparative example in which an Au electrode is formed without laminating a CdZnAs layer. The intensities of the outputs in FIG. 11 are shown as relative values, and the unit of the optical outputs defined by the ordinate can be freely chosen. The laser of the fifth embodiment had a threshold current concentration of 150 $A/cm^2$, which was considerably lower than that of the comparative example. As is evident from this, a material containing Cd can provide such an advantage as obtained from the above-described embodiments.

FIG. 12 is a cross-sectional view, showing a semiconductor laser according to a sixth embodiment of the invention.

In FIG. 12, reference numeral 111 denotes an n-type GaAs substrate, reference numeral 112 an n-type GaAs buffer layer, reference numeral 113 an $n^+$-type ZnSe layer, reference numeral 114 an n-type ZnSSe layer, reference numeral 115 an n-type ZnSe layer, reference numeral 116 a CdZnSe quantum well layer, reference numeral 117 a p-type ZnSe layer, reference numeral 118 an n-type ZnSSe layer, and reference numeral 119 a $p^+$-type ZnSe layer.

An insulating layer 122 is formed on the layer 119, and an Au-Zn electrode 123 is provided on the layer 122. The layer 122 has a contact hole formed therein, and a $Zn_xAs_y$ film 121 functioning as an ohmic contact layer is formed in the contact hole. Thus, the ZnSe layer 119 and electrode 123 are electrically connected to each other via the $Zn_xAs_y$ film 121. An In electrode 124 is formed on the lower surface of the substrate 111.

The optical output characteristic of the laser of the sixth embodiment shown in FIG. 12 and that of a comparative example were examined. In this comparative example, an Au electrode, in place of the Au-Zn electrode 123, was formed directly on the ZnSe layer 119, and hence the $Zn_xAs_y$ film 121 was not provided. It was understood from the examination that the comparative example had a very high oscillation threshold voltage of 15 V, and that the output of the example was saturated when the input current exceeded 1500 $A/cm^{-2}$, though it increased in proportion to the input current in a low level range of current. On the other hand, the laser of the invention had a low threshold voltage of 3 V, and a high output was obtained even when a current of low level was input. It is considered that the low contact resistance of an electrode on the anode side enables the device to show such high performance. FIG. 13 is a cross-sectional view, showing a semiconductor laser according to a seventh embodiment of the invention. This laser can be obtained by applying the invention to a laser disclosed in Electronics Letters, vol. 28, pages 1798-1799. In the seventh embodiment, an n-type ZnMgSSe layer 132 (Eg=2.97 eV) doped with Cl in an amount corresponding to a carrier concentration of $8 \times 10^{17}$ $cm^{-3}$ is formed on an Si-doped GaAs substrate 131. A quantum well multi-layer 133 consisting of six layers is formed on the layer 132. A p-type ZnMgSSe layer 134 and a p-type ZnSe layer 135, which are doped with N to have carrier concentrations of $8 \times 10^{16}$ $cm^{-3}$ and $5 \times 10^{17}$ $cm^{-3}$, respectively, are formed on the layer 133.

An insulating film 137 made of polyimide is formed on the layer 135, and an Au-Zn electrode 138 is provided on the film 137. A contact hole is formed in the insulating film 137, and a $Zn_xAs_y$ film 136 functioning as an ohmic contact layer is formed in the contact hole. Thus, the ZnSe layer 135 and electrode 138 are electrically connected to each other via the film 136. An In electrode 139 is provided on the lower surface of the substrate 131.

The optical output characteristic of the laser of the invention shown in FIG. 13 was examined, and found that the threshold current concentration was 100 $A/cm^2$ at 77K. This value is lower than ½ of a corresponding value (225 $A/cm^2$) disclosed in the above document.

FIG. 14 is a cross-sectional view, showing a semiconductor laser according to an eighth embodiment of the invention, which is obtained by modifying the device shown in FIG. 13. In FIG. 14, reference numerals the same as those in FIG. 13 denote the corresponding elements, and explanation of the elements are omitted. In the eighth embodiment, the ZnSe layer 135 is not employed, and the ZnMgSSe layer 134 and Au-Zn electrode 138 are connected to each other via a ZnMgAs film 141 functioning as an ohmic contact layer. This embodiment also can provide a good ohmic contact at the anode electrode, as in the above-described embodiments.

Elements which can be used for forming the ohmic contact layer of the invention include Mg, Zn, and Cd in the II group, Ga and In in the III group, P and As in the V group, and O, S, Se, and Te in the VI group.

Although in the above embodiments, the invention is applied to a light-emitting diode and a semiconductor laser, it may be applicable to various semiconductors so as to improve a connecting resistance between a metal electrode and a p-type chalcogenide semiconductor layer containing zinc or cadmium, or to prevent an element from being deteriorated by heat in the process of growth thereof, or to prevent the conductivity type from being shifted from the p type to the n type as a result of diffusion of II-group atoms.

Moreover, in the above embodiments, the MBE or MOCVD is used as a method for growing the device, which makes it possible to grow a chalcogenide crystal layer, and to laminate thereon, immediately after the growth, a mixed crystal layer consisting of a II-VI group compound and a III-V group compound, or a II-V group compound semiconductor layer. Therefore, the characteristic of a boundary between the chalcogenide crystal layer and the mixed crystal layer or the II-V group compound semiconductor layer can be prevented from being deteriorated.

It is also possible to laminate the mixed crystal layer or the II-V group compound semiconductor layer even if the semiconductor device is once taken out of a growth apparatus. In this case, a sputtering method or a CVD method can be used as well as the MBE or MOCVD method.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A light-emitting semiconductor device comprising:
    a semiconductor supporting layer comprising an n-type semiconductor substrate;
    a first p-type layer grown on said semiconductor supporting layer and comprised of a chalcogenide semiconductor containing one of zinc and cadmium;
    a second layer grown on said first p-type layer, said second layer being comprised of a mixed crystal semiconductor consisting of Group II, Group III, Group V, and Group VI elements;
    a first electrode formed on said second layer, said first electrode being comprised of a metal; and
    a second electrode formed on said semiconductor supporting layer, wherein a contact resistance between said first p-type layer and said first electrode is reduced by interposing therebetween said second layer.

2. A semiconductor device according to claim 1, wherein said mixed crystal semiconductor consists of a II-VI group compound and a III-V group compound.

3. A semiconductor device according to claim 2, wherein elements contained in said II-VI group compound of said second layer are also contained in said first p-type layer.

4. A semiconductor device according to claim 3, wherein said second layer contains at least 3% by weight of said II-VI group compound.

5. A semiconductor device according to claim 3, wherein said second layer has thickness of at least 1000Å.

6. A semiconductor device according to claim 4, wherein said second layer has a composition such that a percentage by weight of said II-VI group compound is higher than that of said III-V group compound in a portion of said second layer which is adjacent to said first p-type layer, and such that a percentage by weight of said III-V group compound is higher than that of said II-VI group compound in a portion of said second layer which is adjacent to said first electrode.

7. A semiconductor device according to claim 6, wherein a composition of said second layer gradually varies such that a portion of said second layer which is adjacent to said first p-type layer substantially consists of said II-VI group compound, and a portion of said second layer which is adjacent to said first electrode substantially consists of said III-V group compound.

8. A semiconductor device according to claim 6, wherein said second layer consists of a plurality of layer elements such that a concentration of said II-VI group compound contained in a given one of said plurality of layer elements increases as a distance between said given one of said plurality of said layer elements and said first p-type layer decreases.

9. A semiconductor device according to claim 8, wherein a given one of said plurality of said layer elements of said second layer which is directly adjacent to said first p-type layer substantially consists of said II-VI group compound.

10. A semiconductor device according to claim 3, wherein said II-VI group compound and said III-V group compound of said second layer consist of ZnSe and GaAs, respectively.

11. A semiconductor device according to claim 10, wherein said first electrode is comprised of a compound containing Au and Zn.

12. A light-emitting semiconductor device comprising:
    a semiconductor supporting layer comprising an n-type semiconductor substrate;
    a first p-type layer grown on said semiconductor supporting layer and comprised of a chalcogenide semiconductor containing one of zinc and cadmium;
    a second layer grown on said first p-type layer, said second layer being comprised of a II-V group compound;
    a first electrode formed on said second layer, said first electrode being comprised of a metal; and
    a second electrode formed on said semiconductor supporting layer, wherein a contact resistance between said first layer and said first electrode is reduced by interposing therebetween said second layer.

13. A semiconductor device according to claim 12, wherein II group elements contained in said second layer are identical to II group elements contained in said first p-type layer.

14. A semiconductor device according to claim 13, wherein said second layer is comprised of a compound containing Zn and As.

15. A semiconductor device according to claim 13, wherein said second layer is comprised of a compound containing Cd, Zn, and As.

16. A semiconductor device according to claim 14, wherein said first layer is comprised of a compound containing Au and Zn.

17. A semiconductor device according to claim 15, wherein said first layer is comprised of a compound containing Au and Zn.

* * * * *